(12) United States Patent
Kalveram et al.

(10) Patent No.: US 7,095,815 B2
(45) Date of Patent: Aug. 22, 2006

(54) RECEIVER AND METHOD FOR INITIAL SYNCHRONIZATION OF A RECEIVER WITH THE CARRIER FREQUENCY OF A DESIRED CHANNEL

(75) Inventors: Hans Kalveram, Nuremberg (DE); Thomas Reuter, Nuremberg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 897 days.

(21) Appl. No.: 10/080,183

(22) Filed: Feb. 20, 2002

(65) Prior Publication Data

US 2002/0196881 A1    Dec. 26, 2002

(30) Foreign Application Priority Data

Feb. 21, 2001   (DE) ............................ 101 08 110

(51) Int. Cl.
*H04L 7/00* (2006.01)
(52) U.S. Cl. .................... 375/354; 375/376
(58) Field of Classification Search ............ 375/227, 375/354, 362, 365, 376; 370/514
See application file for complete search history.

(56) References Cited

U.S. PATENT DOCUMENTS

| | | | | | |
|---|---|---|---|---|---|
| 5,355,393 | A | * | 10/1994 | Nyenhuis et al. | 375/344 |
| 6,104,767 | A | * | 8/2000 | Atarius et al. | 375/344 |
| 6,133,802 | A | * | 10/2000 | Ma | 331/172 |
| 6,728,326 | B1 | * | 4/2004 | Fulghum | 375/365 |
| 6,738,429 | B1 | * | 5/2004 | Bourdeau | 375/261 |

* cited by examiner

*Primary Examiner*—Emmanuel Bayard
*Assistant Examiner*—Lawrence B. Williams

(57) ABSTRACT

The invention relates to a receiver and a method for initial synchronization of a receiver with the carrier frequency of a desired channel. It can happen during synchronization that the locally generated frequency van indeed be generated correctly although a divider ratio of a variable frequency divider inside the receiver and the reference frequency of a reference oscillator inside the receiver are simultaneously incorrectly set. The incorrect setting is evident in a particularly large skew which is detected in the receiver. In order to avoid such faulty settings even when use is made of budget-priced reference oscillators with relatively large frequency deviations, the skew in the receiver and, should a prescribed threshold value be exceeded, a second and a third control signal are generated in order to correct the divider ratio and the reference frequency.

9 Claims, 4 Drawing Sheets

RECEIVER AND METHOD FOR INITIAL SYNCHRONIZATION OF A RECEIVER WITH THE CARRIER FREQUENCY OF A DESIRED CHANNEL

The invention relates to a receiver, in particular a GSM (Global System for Mobile Communication) receiver with initial synchronization, and to a corresponding method for receiving an analog signal with a desired carrier frequency in accordance with the preamble of claims 1 and 6.

Such a receiver and such a method are known from prior art and are described below in more detail with reference to FIGS. 3 and 4. They are disclosed, for example, in G. Frank, W. Koch, "Initial synchronization of a mobile station in the D-net", PKI Tech. Jour. January 1990 pages 43–49.

In accordance with FIG. 3, an antenna (not shown) is used to receive a multiplicity of radio channels on which signals are received from one or more base stations. For example, the received channels are GSM channels with a spacing of the carrier frequencies of 200 kHz. In a fixed reception filter 1, the first step is to suppress frequencies situated outside the input channels in question such that a bandpass signal mixture is provided at the output of the filter 1. This bandpass signal mixture is downmixed by a mixer 2 with the aid of a locally generated frequency to a complex baseband signal which consists of an in-phase and a quadrature component. A phase locked loop 4 to 7, which consists of a fixed frequency divider 4 for dividing the reference frequency, a variable frequency divider 5 for dividing the locally generated frequency, a phase comparator 6 and a voltage-controlled oscillator 7, is operated on the basis of a quartz reference oscillator 3 in order to generate the local frequency.

The variable frequency divider 5 has a separate input, marked in FIGS. 3 and 4 by the separate arrow, with the aid of which it is possible to preset a desired channel to be received, that is to say its frequency, in particular.

A reception channel is filtered out of the complex baseband signal at the output of the mixer 2 with the aid of a downstream channel selection filter, for example a low pass filter; the output signal of the channel selection filter 8 is denoted below as mixed signal.

If the local frequency generated in the voltage-controlled oscillator 7 corresponds approximately to the carrier frequency of one of the channels occurring in the radio signal, the associated radio channel is received. The channel selection filter 8 also permits the sampling of the mixed signal in a downstream analog-to-digital converter 9.

The reference frequency generated by the quartz reference oscillator 3 is used not only to generate the local frequency at the output of the voltage-controlled oscillator but, via a timer 10, also fixes the receiving instant for the reception of a timeslot, and the sampling instants used in the A/D converter 9.

The time base of the radio receiver is thus coupled directly to the frequency base.

The signal of a radio channel is modulated for digital transmission, for example, by using GMSK (Gassian Minimum Shift Keying), and impaired by the mobile radio transmission, inter alia by multipath propagation.

The datastream consists, for example, in the GSM system, of a sequence of timeslots into which there are inserted at known positions training sequences which permit estimation of the instantaneous channel properties.

The channel properties are estimated in an equalizer 11 by correlation with the training sequence, and the received signal of a timeslot is demodulated, taking account of the intersymbol interference. At its output, the equalizer 11 provides the useful information from the radio signal, received via the antenna, for the purpose of further processing.

FIG. 4 shows a more practical refinement of the receiver in accordance with FIG. 3 which differs from the refinement in accordance with FIG. 3 only by an additional time regulator 12 and an additional frequency regulator 13.

In accordance with FIG. 4, the equalizer 11 has a skew detection device 11*a* for detecting a skew, and a frequency offset detection device for detecting a frequency offset in the received signal. Here, the skew relates to the switching-on instant of the A/D converter 9 at the start of a timeslot, and the frequency offset refers to the carrier frequency 0 of the complex baseband signal.

In other words, the skew represents a time difference between an expected and an actual receiving instant of a test sequence in the received signal. Here, the expected receiving instant is calculated as the time difference between an initial instant prescribed by the control signal, which defines the time base, and the time interval, predefined in the GSM system, between two consecutive test sequences.

The skew detected in the skew detection device 11*a* is evaluated by the time regulator 12 and used to generate a first regulation signal. This first regulation signal serves for regulating the timer and hence for adjusting the initial instant for the reception of future timeslots in the A/D converter 9.

The skew detector 11, a time regulator 12 and a timer 10, which sends to the A/D converter 9 a first control signal for continuously fixing the sampling instants, together form a synchronization circuit for regenerating the symbol clock.

After having been detected by the device 11*b*, the frequency offset is fed to the frequency regulator 13, which provides a second regulation signal on the basis of this frequency offset in order to adjust the quartz reference oscillator 3 via a digital/analog converter 14. The local frequency generated in the oscillator 7 is thus tuned to the carrier frequency of the received desired channel.

The setting up of a radio reception begins as a rule by searching a frequency band for channels with strong signals, and by initial synchronization with the strongest signal. In order to receive a specific channel, the variable frequency divider 5 is preset via the separate inputs such that it tunes the known carrier frequency of the desired channel to the nominal frequency, divided downward by the permanently set frequency divider 4, of the quartz reference oscillator 3.

Firstly, the radio receiver is taken into operation at any desired instant with an arbitrarily selected controlled variable from the A/D converter 14. At the start of the setting up of the radio reception, level measurements are carried out at the site of the equalizer 11 and, finally, for the purpose of initial synchronization, for a channel with a strong reception level use is made of methods for estimating time and frequency which have a relatively wide coverage. When the time regulator 12 and the frequency regulator 13 no longer detect more than only slight deviations, a transition is made to data reception with the previously described equalizer 11.

The receivers described in FIGS. 3 and 4 are affected by the disadvantage that setting up the radio reception is rendered more difficult in the case of use of a quartz reference oscillator with a poor initial frequency accuracy. Presetting the fixed frequency divider 5 to a desired reception channel can result, in the case of poor initial frequency offset of the quartz reference oscillator 3, in the locally generated frequency at the output of the oscillator 7 corresponding not to the carrier frequency of the desired channel, but to the carrier frequency of a neighboring channel. Instead of the desired channel, the mixer 2 and the channel selection filter 8 then receive its neighboring channel. Since, however, both the initial synchronization and the equalizer 11 of this signal can be successfully evaluated and no frequency offset is established, even the frequency regulator cannot correct this frequency offset of the reference oscillator 3.

Despite the reception of the undesired neighboring channel, the received signal can still be searched systematically for strong signals by adjusting the variable frequency divider 5 and the second regulation signal. Moreover, it is also possible to use known methods of initial synchronization and equalization without knowing the actual carrier frequency of the received signal. Admittedly, in this case the correct carrier frequency of the desired channel is generated as a local frequency at the output of the voltage-controlled oscillator 7, but this correct setting is based on a simultaneous maladjustment of the variable frequency divider 5 and of the quartz reference oscillator 3. More exactly speaking, the setting of the variable frequency divider 5 deviates from the setting which is correct in relation to the nominal frequency of the reference oscillator 3.

This situation can be illustrated mathematically as follows:

$$fHF = n * fph \quad \rightarrow \text{correct timing}$$
$$= (n+1) * (fph - df) \quad \rightarrow \text{incorrect timing}$$
$$= (n-1) * (fph + df) \quad \rightarrow \text{incorrect timing}$$

where it holds that:
fHF="correct" frequency of the voltage-controlled oscillator
fph=phase comparison frequency (typically 200 kHz in GSM)
df=deviation (error in the phase comparison frequency)
n="correct" divider of the variable frequency divider If the divider ratio is selected as n+1 or n−1, a matching error of the reference oscillator 3 can lead to a correct frequency of the voltage-controlled oscillator VCO 7.

The frequency of the VCO 7 is always a multiple of the phase comparison frequency, which typically amounts to 200 kHz in GSM systems. The phase comparison frequency is obtained in the receiver by suitable division of the reference frequency with the aid of the permanently set frequency divider 4. VCO frequencies of approximately 900 or 1800 MHz are generated in this way in the GSM system.

As already indicated above, because of the correctly generated local frequency, no frequency offset is established and, therefore, the frequency offset cannot serve as indicator of a simultaneous maladjustment of the variable frequency divider 5 and the reference oscillator 3.

The reference frequency generated by the reference oscillator 3 serves, however, not only to generate the local frequency, but also to drive the timer and hence to generate the first control signal. This double function of the reference frequency was denoted above as rigid coupling between the time base and the reference frequency.

However, via the drive of the timer 10 a qualitatively poor reference oscillator with an initial frequency offset, that is to say an oscillator whose frequency deviates substantially from the nominal frequency, causes time shifts in the sampling instants of the A/D converter 9 which are prescribed by the timer 10 via the first control signal. By comparison with the length of the received timeslots, these time shifts are very slight and therefore scarcely matter with regard to the performance of the algorithms used in the equalizer 11. Moreover, it is possible to estimate and compensate these shifts in the equalizer 11.

However, as soon as these time shifts exceed a certain threshold value, effects they cause become clearly noticeable, particularly over lengthy time intervals of approximately 50 ms. The effects occur, for example, between the synchronization messages sent in a regular time pattern in the GSM system by all base stations.

Starting from this prior art, it is the object of the present invention to develop the above-described receiver, known from the prior art, and an associated method in such a way as to avoid simultaneous maladjustment of a variable frequency divider and reference frequency even when use is made of budget-priced reference oscillators with an initial frequency offset, and to avoid the negative effects, resulting therefrom, of time shifts.

This object is achieved for the receiver described by virtue of the fact that it additionally has:

a comparator for receiving the output signal of the skew detection device in order to establish whether the skew exceeds a prescribed threshold value, and to output a corresponding information signal; and an evaluation device for calculating and outputting a corrected reference frequency in the form of a second control signal via a D/A converter to the reference oscillator, and for calculating and outputting a corrected divider ratio in the form of a third control signal to the variable frequency divider circuit such that the reference oscillator is set to the corrected reference frequency and the frequency divider circuit is set to the corrected divider ratio, the calculation and outputting of the corrected reference frequency and of the corrected divider ratio taking place only when the skew exceeds the threshold value as determined by the information signal.

This refinement of the receiver according to the invention has the advantage that, for the purpose of generating the reference frequency it is possible to make use of budget-priced reference oscillators whose reference frequency has to satisfy only modest demands in respect of accuracy. These modest demands on the accuracy of the reference frequency permit, in particular, the use of budget-priced crystals; for specific applications it is even possible to dispense entirely with the use of crystals. Furthermore, because of the modest demands placed on the accuracy of the reference frequency of the receiver, the expensive temperature compensation circuits and time-consuming adjusting operations can also be dispensed with.

In accordance with a first exemplary embodiment of the invention it is advantageous to compensate the described skew by using a time regulation device, the time regulation device advantageously generating a regulation signal for the timer as determined by the output signal of the skew detection device.

It is advantageous, furthermore, when the time regulation device generates the regulation signal for the timer while additionally taking into account the second control signal output by the evaluation device. In this case, a reference frequency newly reset via the second control signal can be taken into account as the input signal for the timer during the time regulation.

It is advantageous, furthermore, when the receiver has a frequency offset detection device for detecting a frequency offset between the locally generated frequency and the carrier frequency of the received signal and, additionally, has a frequency regulation device for compensating this frequency offset. During generation of the second regulation signal, the frequency regulation device advantageously takes into account not only the frequency offset, but also the second control signal, in order to satisfy also a possibly required new presetting of the reference oscillator to a new preset reference frequency.

The expected and the actual receiving instant of the received signal is advantageously defined with reference to test sequences, included in the received signal, with prescribed time intervals.

The object of the invention is achieved, furthermore, by the method defined in claims 6 to 9. The advantages of this method correspond to the advantages stated above for the receiver.

Attached to the description are a total of four figures, where:

Various embodiments of the receiver according to the invention will be explained hereinafter with reference to FIGS. 1 and 2.

Figure 1:
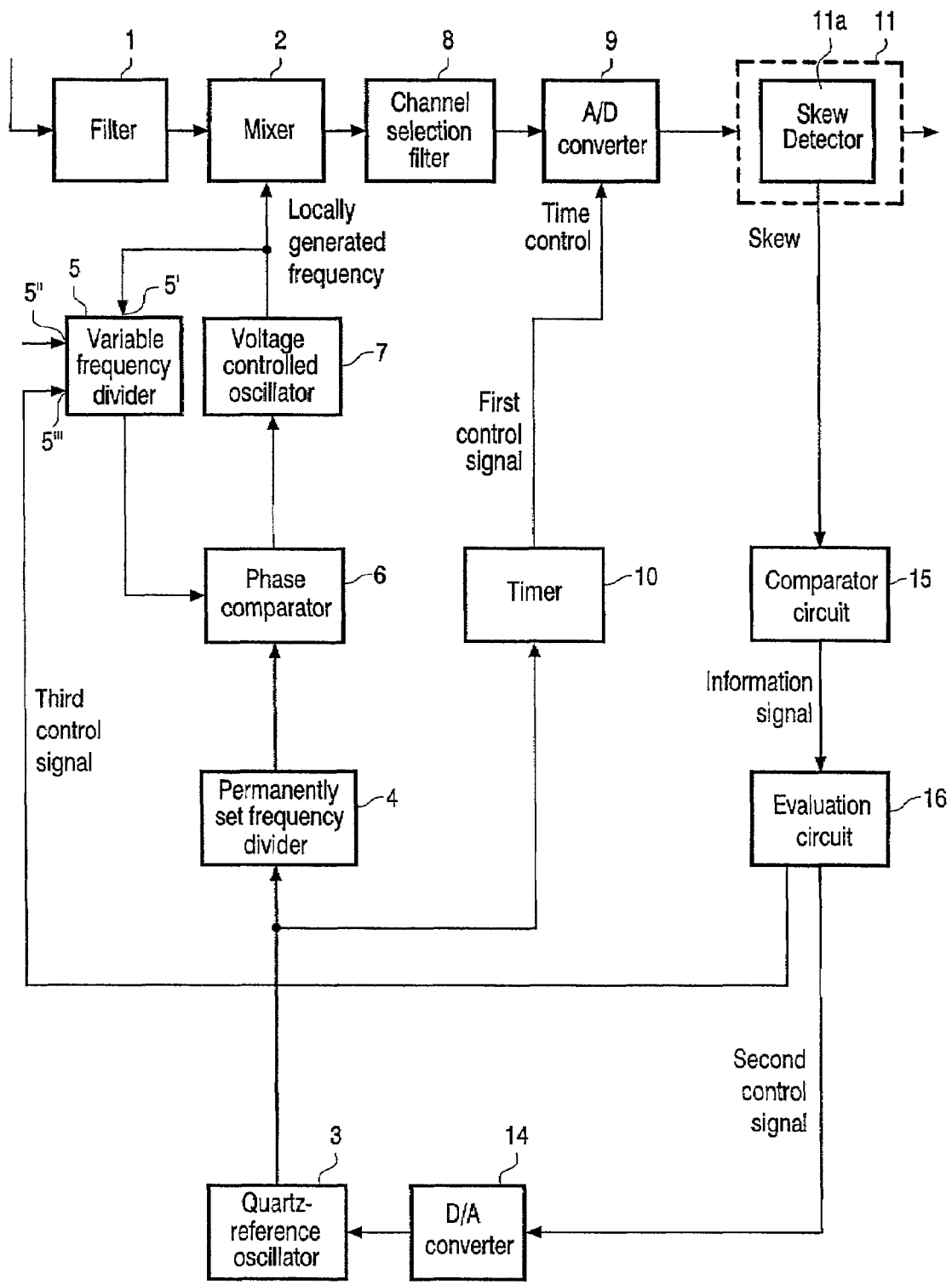
FIG. 1 shows a receiver in accordance with a first exemplary embodiment of the present invention.
Figure 3:
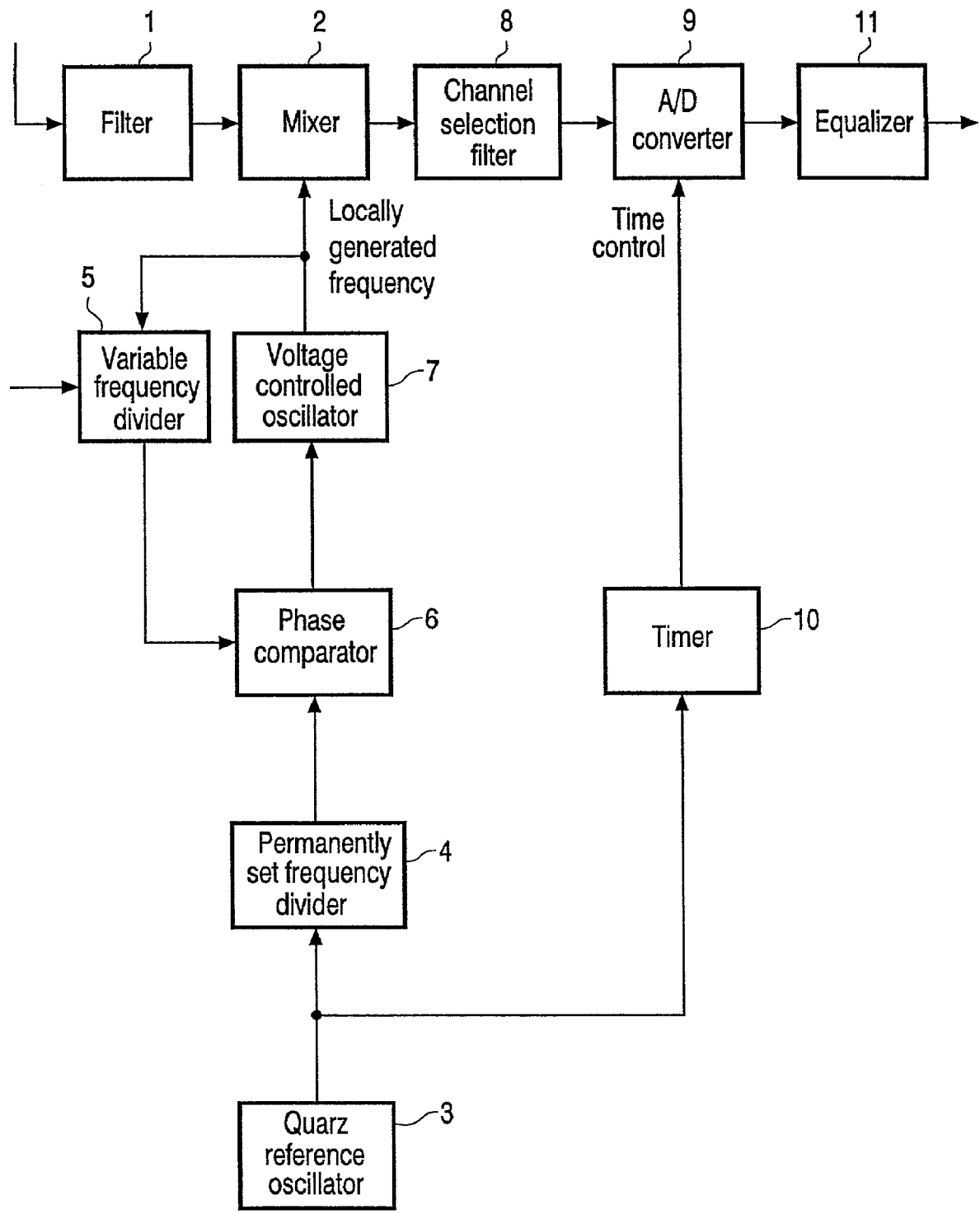
FIG. 3 shows a receiver in accordance with a first exemplary embodiment from prior art.

FIG. 1 shows a first exemplary embodiment of the invention, the design and the mode of operation of the components 1 to 11 of the receiver corresponding in principle to those of the receiver from prior art as described above with reference to FIG. 3.

The receiver in accordance with FIG. 1 additionally has a skew detector 11a, a comparator circuit 15, an evaluation circuit 16 and a D/A converter 14 whose function and cooperation with the components from prior art are described below.

As described above, as a result of an initial synchronization according to prior art it can happen that the voltage-controlled oscillator 7 admittedly generates a correct local frequency in the receiver, but does so by assuming an incorrect channel assignment. This incorrect channel assignment means that, as described above, the reference oscillator has a frequency deviation which is compensated by a simultaneously incorrectly set division factor in the case of the variable frequency divider 5 in such a way that the correct frequency is generated nevertheless at the output of the oscillator 7.

The deviation of the reference frequency from the nominal reference frequency becomes evident through the described rigid coupling of the frequency base and time base in the receiver, in particular in a displacement of the time base. This displacement of the time base corresponds to a skew between an expected and an actual receiving instant of the received signal. This skew occurs both in the case of the receiver according to the prior art in accordance with FIG. 3, and in the case of the receiver according to the invention in accordance with FIG. 1. However, by contrast with the prior art, this skew is detected by the skew detection device 11a, which can be implemented in the equalizer 11, for example.

The described coupling between the frequency base and the time base is already present in the case of the generation of the received signal in a transmitter, that is to say before reception by the user, and is only slightly disturbed during the radio propagation of the signal. It is therefore to be assumed that a disturbance of this coupling observed in the receiver in the form of a leading or lagging system time, or in the form of an established skew, is an unambiguous indicator for an incorrect channel assignment in the initial synchronization previously performed.

In other words, when an established skew exceeds a predetermined threshold value it then serves as an indicator for an incorrectly set divider ratio of the variable frequency divider 5. The comparator circuit 15 according to the invention is provided in order to establish whether the measured skew exceeds or falls below the predetermined threshold value. If the skew is below the threshold value, that is to say if the coupling between the frequency base and time base is only slightly disturbed, it is assumed that this has possibly occurred during the radio propagation and it is, therefore, not necessarily possible to infer an incorrect channel assignment inside the receiver. On the other hand, if the established skew is greater than the threshold value, that is to say greater than could have been caused only by a disturbed radio propagation, it is assumed according to the invention that there is an incorrect channel assignment.

Such an evaluation of the skew is performed in the evaluation circuit 16 according to the invention. On the basis of the magnitude of the established skew, it calculates a corrected divider ratio and transmits it in the form of a third control signal to the variable frequency divider 5. The evaluation circuit 16 further uses the established skew to calculate a corrected reference frequency and transmits it in the form of a second control signal to the reference oscillator 3 via the D/A converter 14. The correction of the divider ratio via the input 5''' of the variable frequency divider 5 and the correction of the reference frequency via the second control signal are ideally undertaken precisely in opposite directions and at the same time such that, as far as possible, the correct local frequency generated by the voltage-controlled oscillator 7 does not change; suitable synchronization of the receiver with the carrier frequency of the desired channel in the received signal is ensured in this way.

Figure 2:
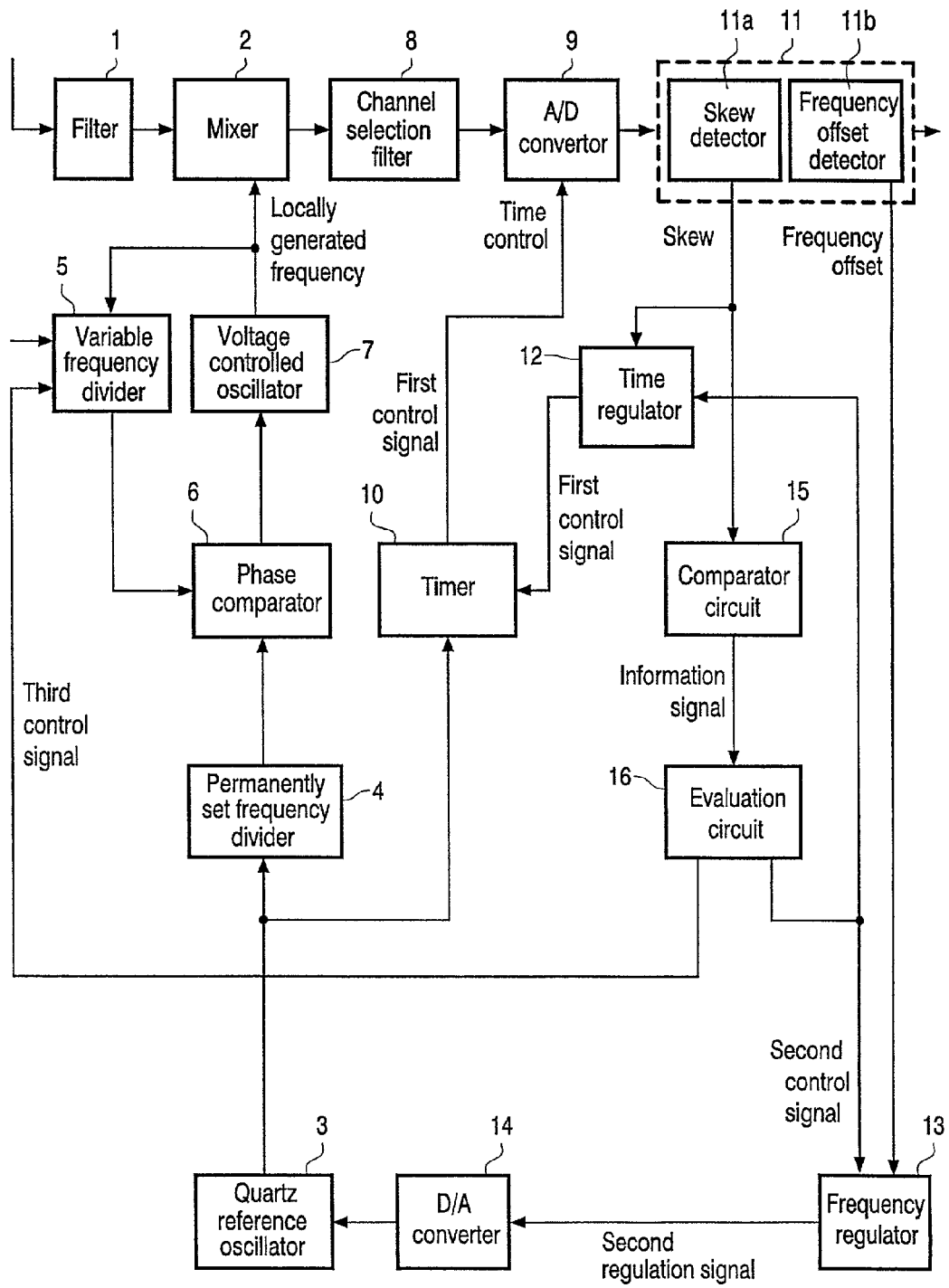
FIG. 2 shows a receiver in accordance with a second exemplary embodiment of the invention.
Figure 4:
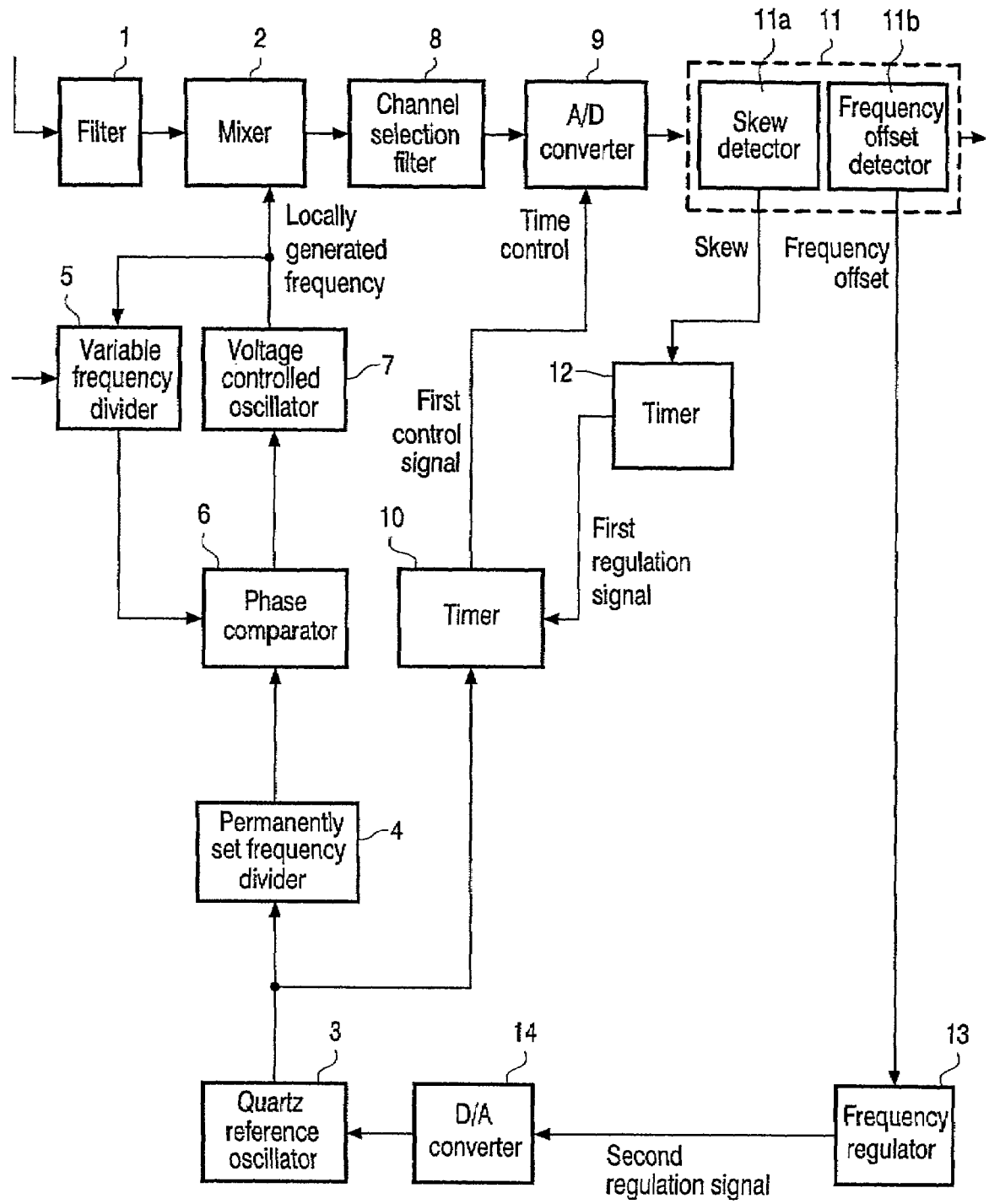
FIG. 4 shows a receiver in accordance with a second exemplary embodiment in accordance with prior art.

FIG. 2 shows a second exemplary embodiment of the receiver according to the invention, which corresponds with regard to its design and its fundamental mode of operation to the receiver in accordance with FIG. 4 as known from prior art; in particular, this also holds for the time regulator 12 and the frequency regulator 13.

However, by contrast with prior art, the receiver according to the invention in accordance with FIG. 2 has the comparator circuit 15 and the evaluation circuit 16, the function of which has already been explained above with reference to FIG. 1. In the second exemplary embodiment of the receiver in accordance with FIG. 2, the second control signal, generated by the evaluation circuit 16 now serves, however, as the second input variable both for the time regulator 12 and for the frequency regulator 13. It is ensured in this way that both the first regulation signal generated by the time regulator 12, and the second regulation signal generated by the frequency regulator 13, are generated while taking into account the reference frequency of the reference oscillator 3 to be corrected. More precisely, the second regulation signal in accordance with this exemplary embodiment can serve both for the correction of the presetting of the reference oscillator 3 to a new reference frequency and for the subsequent correction of the newly preset reference frequency.

The basic idea of the invention can be defined in that the carrier frequency of the high-frequency transmission, that is to say the carrier frequency of the received signal, and the frequency of the symbol clock of the digital modulation are used together for synchronizing the receiver.

The skew detection device 11 establishes the displacement of the sampling instant of the symbols by comparison with the ideal position in each case, and signals a skew averaged over a sufficiently long time both to the time regulator 12 and to the comparator circuit 15. A small skew is used solely by the time regulator 12 according to the prior art for regenerating the symbol clock. If, however, a threshold value is exceeded in the comparator circuit 15, improved settings of the variable frequency divider 5 and of the D/A converter 14 are calculated in the evaluation device 16 in order to control the reference oscillator 3.

Whether the time regulator 12 and the frequency regulator 13 have already settled can be checked by receiving and evaluating a third synchronization message in the received signal.

The comparator circuit 15 according to the invention and the evaluation circuit 16 can be put out of operation after the divider ratio of the variable frequency divider 5 and the reference frequency of the reference oscillator 3 have been corrected either in the first or in the second exemplary embodiment of the receiver, and synchronization of the receiver has been achieved. Renewed activation of these components 15 and 16 is not necessary again until there is a need to set up radio reception again completely, that is to say after a lengthy interruption of all the receiving connections, for example.

The invention claimed is:

1. A receiver, in particular a GSM receiver, with initial synchronization for receiving an analog signal with a desired carrier frequency, comprising:
    a reference oscillator for generating a reference signal with a reference frequency;
    a phase lacked loop with a variable frequency divider circuit for generating a local frequency which corresponds at least approximately to the desired carrier frequency;
    a mixer for generating a mixed signal by mixing the locally generated carrier frequency with the desired carrier frequency;
    a timer for generating a first control signal as determined by the reference signal;
    an A/D converter for receiving and digitizing the mixed signal starting from an expected receiving instant which is predetermined by the first control signal; and
    a skew-detection device for receiving the digitized mixed signal and for generating an output signal, the output signal representing a skew between an expected and an actual receiving instant of the received signal;
    characterized in that there are provided a comparator for receiving the output signal of the skew-detection device, in order to establish whether the skew exceeds a prescribed threshold value, and to output a corresponding information signal; and
    an evaluation device for calculating and outputting a corrected reference frequency in the form of a second control signal, via a D/A converter, to the reference oscillator, and for calculating and outputting a corrected divider ratio in the form of a third control signal to the variable frequency divider circuit such that the reference oscillator is set to the corrected reference frequency and the frequency divider circuit is set to the corrected divider ratio, the calculation and output of the corrected reference frequency and of the corrected divider ratio being performed only when the skew exceeds the threshold value as determined by the information signal.

2. A receiver as claimed in claim 1, characterized in that there is provided a time regulation device for compensating the skew by generating a regulation signal as determined by the output signal of the skew-detection device, and for outputting the regulation signal to the timer.

3. A receiver as claimed in claim 2, wherein the time regulation device receives the second control signal output by the evaluation device, and takes account of it when generating the regulation signal.

4. A receiver as claimed in claim 1, characterized in that there are provided a frequency offset detection device for generating an output signal which represents a frequency offset between a locally generated frequency and the carrier frequency of the received signal, and a frequency regulation device for compensating this frequency offset by generating a second regulation signal in response to the output signal of the frequency offset detection device and to the second control signal, and for outputting the second regulation signal via the D/A converter, to the reference oscillator in order to regulate the respective preset reference frequency.

5. A receiver as claimed in claim 1, wherein the expected and the actual receiving instant of the received signal are defined with reference to test sequences in the received signal.

6. A method for initial synchronization of a receiver with a carrier frequency of a desired channel, said method comprising the steps of:
    generating a reference frequency;
    generating a local frequency from the reference frequency with the aid of variable frequency division, the local frequency corresponding at least approximately to the carrier frequency of the desired channel;
    mixing the locally generated carder frequency with the carrier frequency of the desired channel in order to generate a mixed signal;
    generating a first control signal from the reference frequency, which control signal represents a time base for receiving the mixed signals;
    determining the magnitude of a skew between an expected receiving instant for the reception of the mixed signal and the instant of an actual occurrence of the mixed signal; checking whether the established skew is greater than a prescribed threshold value, and in that case setting a corrected divider ratio for the variable frequency division and
    presetting a corrected reference frequency.

7. A method as claimed in claim 6, characterized in that is includes a step in which the time base is regulated as determined by the magnitude of the skew.

8. A method as claimed in claim 7, wherein the regulation of the time base is performed additionally while taking account of the corrected reference frequency.

9. A method as claimed in claim 6, characterized in tat it also includes a step for determining the magnitude of a frequency offset between the locally generated frequency and the desired carrier frequency, and for regulating the respective set reference frequency as determined by the determined frequency offset.

* * * * *